United States Patent [19]

Jaecklin et al.

[11] Patent Number: 5,587,594
[45] Date of Patent: Dec. 24, 1996

[54] SEMICONDUCTOR COMPONENT HAVING GATE-TURN-OFF THYRISTOR AND REDUCED THERMAL IMPAIRMENT

[75] Inventors: André Jaecklin, Ennetbaden; Ezatollah Ramezani, Möriken; Peter Roggwiller, Riedt Neerach; Andreas Ruegg, Gebenstorf, all of Switzerland; Thomas Stockmeier, Rancho Palos Verdes, Calif.; Peter Streit, Widen; Jurg Waldmeyer, Dottikon, both of Switzerland

[73] Assignee: ABB Management AG, Baden, Switzerland

[21] Appl. No.: 375,662

[22] Filed: Jan. 20, 1995

[30] Foreign Application Priority Data

Feb. 4, 1994 [DE] Germany ................... 44 03 429.6

[51] Int. Cl.⁶ ....................................... H01L 29/74
[52] U.S. Cl. ...................... 257/138; 257/146; 257/147; 257/153; 257/170; 257/171
[58] Field of Search ...................... 257/138, 139, 257/140, 144, 146, 147, 149, 152, 153, 170, 178, 181, 171

[56] References Cited

U.S. PATENT DOCUMENTS

| | | | |
|---|---|---|---|
| 4,742,382 | 5/1988 | Jaecklin | 257/149 |
| 5,210,601 | 5/1993 | Kitagawa et al. | 257/133 |
| 5,248,622 | 9/1993 | Matsuda et al. | 257/747 |

FOREIGN PATENT DOCUMENTS

| | | | |
|---|---|---|---|
| 0200863 | 2/1986 | European Pat. Off. | 257/153 |
| 0283588 | 9/1988 | European Pat. Off. | 257/147 |
| 0387721 | 9/1990 | European Pat. Off. | 257/152 |
| 2041727 | 3/1971 | Germany | 257/138 |
| 3509745C2 | 4/1992 | Germany | 257/153 |
| 3722425C2 | 10/1992 | Germany | 257/147 |
| 62-163371 | 7/1987 | Japan | 257/153 |
| 1-253274 | 10/1989 | Japan | 257/153 |

*Primary Examiner*—Minhloan Tran
*Attorney, Agent, or Firm*—Burns, Doane, Swecker & Mathis, L.L.P.

[57] ABSTRACT

To provide thermal relief, particularly of the edge of disk-shaped gate-turn-off GTO thyristors (GTO) as are used in converters in power electronics, at least one cooling segment which is isolated from a GTO cathode metallization of the GTO thyristor segment (GTO) by a gate electrode metallization of a gate electrode is arranged on the edge and laterally adjacent to the GTO thyristor segment (GTO). An insulation layer is provided between a cooling segment metallization and the gate electrode metallization. Cooling segments in an lo outer annular zone can be alternately arranged with GTO thyristor segments (GTO) or offset towards the outside in the radial direction or perpendicular direction thereto. Instead of cooling segments, a p⁺-type GTO emitter layer of the GTO thyristor segments (GTO) can be shortened at the edge in the outer annular zone. The edge side of these GTO thyristor segments (GTO) can exhibit a shorter charge carrier life than the remaining semiconductor body due to irradiation with electrons, protons or α-particles, which results in a lower operating current in this area. An ohmic impedance can be connected in series with a diode between a gate electrode and a cathode of the GTO thyristor (GTO) for stabilizing the trigger threshold and reducing its temperature dependence.

22 Claims, 1 Drawing Sheet

SEMICONDUCTOR COMPONENT HAVING GATE-TURN-OFF THYRISTOR AND REDUCED THERMAL IMPAIRMENT

BACKGROUND OF THE INVENTION

1. Field of the Invention

The invention is based on a gate-turn-off semiconductor component.

2. Discussion of Background

In U.S. Pat. No. 5,248,622, a gate-turn-off alloyed semiconductor component in the technology of the free pressure contact is specified, the semiconductor body of which exhibits at the edge a silicone resin which acts as a thermal relief when the semiconductor body is built into a housing. Such thermal edge relief is insufficient for non-alloyed power semiconductors.

From EP-A2-0 387 721, a gate-turn-off thyristor is known in which a turn-off electrode at the edge for extracting the minority charge carriers accumulated in a base layer also effects a thermal edge relief. This thyristor requiring two gates is unsuitable for power modules.

From DE-C2-3 509 745, a gate-turn-off thyristor is known in which, for compensating for the unequal feed resistances of a point gate contact in a sector in the area closely around the gate supply point, a longer carrier life is set than in a sector in its far area. This neither attempts nor achieves thermal edge relief.

German Offenlegungsschrift 2 041 727 discloses a semiconductor wafer on which, in an annular zone, several radially aligned GTO thyristor segments are arranged which exhibit no cathode metallization at the edge in order to achieve a uniform current distribution over the entire cathode area by means of an increase in resistance at the edge during turn-off.

In DE-C2-3 722 425, a GTO thyristor having several GTO segments arranged in concentric rings is described in which, for achieving equal turn-off times and to avoid thermal breakdowns, particularly in the thyristor units farther removed from the gate connection, the width of the annular emitter areas at the anode side in a ring farther removed from the gate connection is smaller than the corresponding ring width in a ring located closer to the gate connection.

The disadvantageous factor in this arrangement is that the adaptation of the anode-emitter widths favors not only the turn-off process but also impedes the turn-on process and thus puts the turn-on homogeneity of the element at risk.

From EP-A2-0 283 588, a GTO thyristor is known in which, for uniform activation of the parallel-connected individual elements, GTO thyristor segments arranged in an outer ring exhibit a smaller electrical resistance between cathode contact and gate contact than in an inner ring. In the outer ring, a gate distance from the n-type emitter of 50 μm can be set whilst it is 150 μm in the inner ring. The electrically effective distance can be set by an insulation layer which engages below the respective adjoining metallization of cathode and control electrode. Different resistances can also be achieved by layers with different thicknesses of the p-type base layer at the locations at which it emerges on the surface. At these locations, the p-type base layer can also exhibit a different doping profile; a more highly doped additional layer can also be applied there.

A disadvantage of these methods consists in that the impairment of the unfavorably placed segments depends not only on their position but also on the type of activation. Depending on whether this activation accentuates or suppresses the difference between the segments, the countermeasure initiated according to the arrangement is inadequate or overcompensating.

Gate-turn-off thyristors, so-called GTO thyristors, are used as power semiconductor components, particularly in high-power converters. In these arrangements, the method of pulse-width modulation is frequently used for regulation, in which the GTO thyristors are turned on and off with an approximately constant switching frequency which is independent of input and output frequencies. The electrical power dissipation produced in the elements during this process is an important dimensioning criterion since it actively heats up the component and must therefore be removed by cooling, taking into consideration the maximum permissible transition temperature and the thermal resistances between semiconductor body and heat sink.

The entire electrical power dissipation produced in the semiconductor body can be subdivided into static losses, on the one hand, which depend on the mean pulse cycle and into dynamic losses, on the other hand, which are proportional to frequency and are composed of turn-on and turn-off losses. All these loss components are temperature-dependent. This is why, naturally, the heating-up rate itself also becomes a function of the transition temperature.

Whilst the temperature dependence of most of the loss components (static ones, turn-on) is smaller rather than larger, the turn-off losses per pulse rise distinctly at higher temperatures. Since, at the same time, the storage time also increases which unfavorably influences the current distribution during the turn-off phase, a thermal instability can arise in which some of the element surface is heated up more and more and finally exceeds the permissible maximum temperature without the element as a whole reaching the thermal limit data.

With respect to the relevant prior art, reference is also made to EP-B1-0 200 863 from which a semiconductor component with GTO thyristor and diode structure is also known. The diode structure is mounted on the outer edge of the disk-shaped semiconductor at a distance of ≦1 mm circularly around GTO thyristor segments annularly arranged and is connected in antiparallel with the GTO thyristor. The charge carrier life in the diode is set to be shorter than in the thyristor by installing heavy metal atoms such as gold or platinum into the silicon base material of the semiconductor component or by electron or gamma irradiation. Between the diode and the GTO gate electrode segments, a resistor or, respectively, a circular protective zone with an electrically insulating passivation layer is provided which decouples the thyristor and diode areas from one another so that only few charge carriers can cross over into the other areas in each case.

SUMMARY OF THE INVENTION

Accordingly, one object of the invention is to further develop a gate-turn-off semiconductor component of the type initially mentioned in such a manner that the thermal impairment of certain areas of its semiconductor body, especially of its edge, is reduced.

An advantage of the invention consists in that unavoidable small electrical inequalities can only have a negative effect at very high currents. This is achieved mainly by increasing the mean cooling power available per segment in the edge area by suitable measures, as far as possible without the support area of the GTO elements in the edge area decreasing further as a result and thus further increasing the sensitivity to an inhomogeneous pressure distribution.

The invention is based on the idea that, after all, thermal overheating occurs and endangers the GTO element function when a local heating already produced can no longer be compensated for by increased cooling power. This increased cooling power has to do with the increased temperature gradients in the vicinity of the overheated location and depends on the size of this location. If a normal disk cell is analyzed with respect to this additional cooling power, it becomes clear that the GTO element edge represents a thermal weak point because a lateral thermal equalization can virtually only take place inwardly and not in all directions at this location.

In the case of disk cells, a pressure inhomogeneity forms after repeated imperfect plane clamping, in most cases due to slight deformation of casing and metalization, to the extent that parts of the edge have a less specific contact pressure and thus are subject to less cooling. Due to greater thermal resistances at the dry transitions, the GTO element edge has a distinctly greater tendency to premature thermal overheating even if element inhomogeneities are otherwise uniformly distributed. On the basis of practical experience, this thermal impairment of the edge must be given much greater weight in large GTOs than the inhomogeneities due to the arrangement of the connection of the gate electrode which have already been discussed several times.

A further advantage according to an advantageous embodiment of the invention consists in that the triggering currents have fewer differences within a temperature range of −40° C. to 125° C., and thus more accurate triggering becomes possible.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
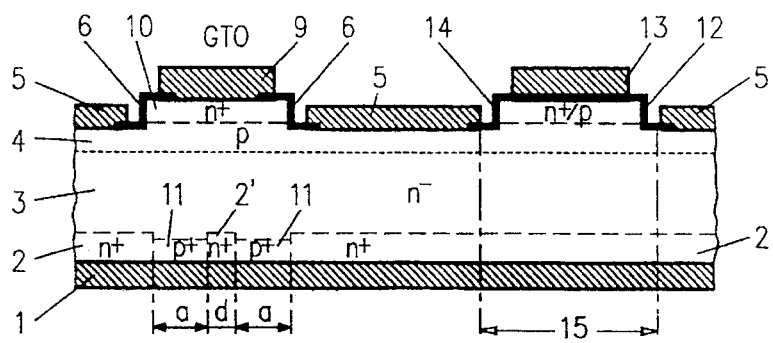
FIG. 1 shows a cross section through part of a gate-turn-off semiconductor component having a GTO thyristor segment and a cooling segment.
Figure 4:
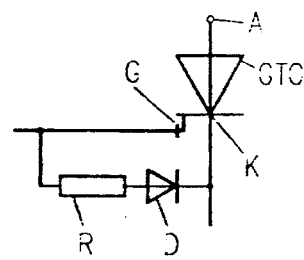
FIG. 4 shows a circuit diagram of the gate-turn-off semiconductor component with a trigger stabilization diode.

Referring now to the drawings, wherein like reference numerals designate identical or corresponding parts throughout the several views, FIG. 1 shows a section of a cross section through a disk-shaped semiconductor component with laterally adjacent areas of a GTO thyristor segment (GTO) and of a cooling segment (15) which is arranged at the edge with respect to the GTO thyristor segment (GTO). On the underside of this semiconductor component, an anode metallization (1), for example of aluminum, is provided which, as anode (A), compare FIG. 4, represents a 1st main electrode of the gate-turn-off semiconductor component. On the top of this semiconductor component, a GTO cathode metallization (9) is provided which is connected electrically via a molybdenum pressure plate, not shown, and possible other intermediate layers to a cooling segment metallization (13) and, as cathode (K), represents a 2nd main electrode of the gate-turn-off semiconductor component. In operation, the contact plate at the cathode side is thermally conductively connected to a heat sink, not shown, for removing the dissipation heat of the semiconductor body. (5) designates a gate electrode metallization which surrounds the GTO cathode metallization (9) and the cooling segment metallization (13) with a predeterminable resistance distance and is lower than the latter so that the electrical connection is conducted away laterally below the pressure plate, not shown, to a central or annular opening, not shown, and from there laterally to the outside in an insulated manner via a separate contact member, not shown.

The semiconductor component mainly consists of a relatively thick n-conducting $n^-$-type base layer (3) with low doping, on which a p-conducting p-type base layer (4) is applied on the cathode side. On this p-type base layer (4), a highly doped n-conducting $n^+$-type GTO emitter layer (10) is applied in the cathode area of the GTO thyristor segment (GTO), which emitter layer is laterally slightly larger than the GTO cathode metallization (9). With about the same lateral extent as the $n^+$-type GTO emitter layer (10), a highly doped p-conducting $p^+$-type anode-emitter layer (11) is applied on the anode side of the $n^-$-type base layer (3) and below the $n^+$-type GTO emitter layer (10). At a slight lateral distance from this $p^+$-type anode-emitter layer (11), a highly doped n-conducting $n^+$-type short-circuit layer (2) and (2'), which short-circuits the $p^+$-type anode-emitter layer (11), is applied on the anode side in the remaining lateral area on the $n^-$-type base layer (3). This short-circuit layer can have different patterns, for example as shown in FIG. 1, with a narrow strip of the $n^+$-type short-circuit layer (2') in the center of the $p^+$-type anode-emitter layer (11) or without such a strip (2'). This $n^+$-type short-circuit layer (2') has a width (d), which is preferably smaller than a width (a) of the $p^+$-type anode-emitter layer (11). The triggering time of the GTO thyristor segment (GTO) can be influenced by varying this width (a).

An electrical insulation layer (6) covers the lateral edge of the $n^+$-type GTO emitter layer (10) and the intermediate space between the GTO cathode metallization (9) and the gate electrode metallization (5), the two metallizations (9, 5) covering the edge area of the insulation layer (6). An electrical insulation layer (14) covers the upper surface and the lateral edge of a cooling segment boundary layer (12) and the intermediate space between the cooling segment metallization (13) and the gate electrode metallization (5) which covers the edge area of the electrical insulation layer (14). The cooling segment boundary layer (12) can be an $n^+$-type GTO emitter layer (10) or a p-type base layer (4).

Figure 2A:
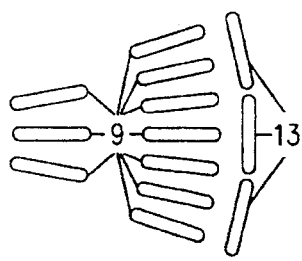
FIGS. 2a–2c show sector-like sections of a semiconductor component in a top view with GTO thyristor segments and cooling segments which are differently arranged at the edge.
Figure 2B:
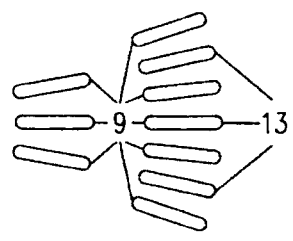
Figure 2C:
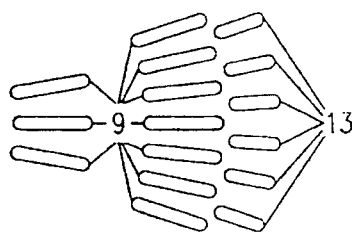

FIGS. 2a–2c show a top view of a section of different sector-shaped arrangements of GTO thyristor segments (GTO) and, respectively, GTO cathode metallizations (9) and cooling segment metallizations (13). In FIG. 2a, the alignments of the elongated cooling segment metallizations (13) at the edge are essentially oriented perpendicularly to the alignments of the elongated GTO cathode metallizations (9). In FIG. 2b, cooling segment metallizations (13) alternating with GTO cathode metallizations (9) are essentially radially aligned like the GTO cathode metallizations (9) in the outer annular zone. In FIG. 2c, the cooling segment metallizations (13) are displaced towards the outer edge, in distinction from those in FIG. 2b, or arranged staggered offset with respect to the GTO cathode metallizations (9). The cooling segment metallizations (13) at the edge provide additional cooling in operation in these arrangements.

Figure 3:
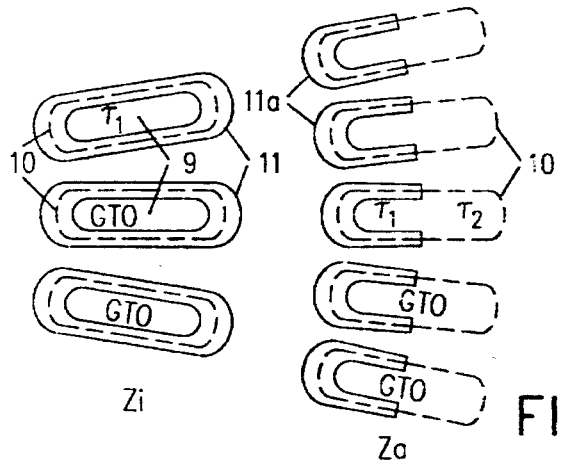
FIG. 3 shows a sector-like section of a semiconductor component in a top view with GTO thyristor segments with a special anode-emitter structure in the edge area.

FIG. 3 shows in a further embodiment of the invention a section of a sector of a semiconductor body in a top view, in which no cooling segments (15) are provided. In distinction from GTO thyristor segments (GTO) in an inner annular zone (Zi), GTO thyristor segments (GTO) in an outer annular zone (Za) exhibit $p^+$-type GTO emitter layers (11a) which are preferably shortened by 50% at the edge so that, although normal triggering of the edge segments is guaranteed at any time, less current is handled by these edge segments in the turned-on state and less power is to be turned off than in the case of the GTO thyristor segments (GTO) in the inner annular zone (Zi). Turn-off delay time and storage time are comparable. This makes it possible to reduce the power dissipation per segment distinctly without having to accept significant disadvantages, the dynamic turn-on and -off characteristics being approximately the same.

According to a further embodiment of the invention, an additional reduction in the charge carrier life ($\tau_2$) compared with a charge carrier life ($\tau_1$) in the inner annular zone (Zi) or at the inner end of the fingers can be achieved, for example, by masked electron irradiation of the outermost ring (Za) of the GTO thyristor segments (GTO), preferably on the outermost finger, in addition to or instead of a $p^+$-type GTO emitter layer (11a) which is shortened at the edge. This, too, makes it possible to reduce the power dissipation produced in the outer annular zone (Za) since, on the one hand, a lower current density occurs in the on state and, on the other hand, a shorter turn-off loss time is also produced by this means during turn-off because of the lower carrier density and, finally, a shorter reverse recovery time corresponding to the reduced charge carrier life ($\tau_2$) is to be expected.

This type of embodiment is very flexible since it can be easily dosed or optimized via the additional irradiation dose without changing masks and is very effective. To ensure masking of the irradiation with electrons which is easy to handle and is accurate, it is advantageous to use relatively low-energy electrons with an energy in the range of 1 MeV-2.5 MeV, at least for the additional irradiation to be carried out, since these electrons can be easily masked by means of, for example, 2-mm-thick molybdenum masks whilst a sufficiently homogeneous effect for achieving the intended edge relief is still generated with a silicon thickness of 1 mm.

As an alternative, a selective irradiation even with protons or α-particles can be carried out which, as is known, provide for much more localized lowering of the charge-carrier life ($\tau_2$). These types of irradiation can be masked even more easily and accurately. It is possible to trim the outer half of the GTO thyristor segments (GTO) of the outermost annular zone (Za) by introducing a life sink close to the anode in such a manner that, in the main, a dosed shorter reverse recovery time of the turn-off process is produced and thus the reduction in power dissipation density in this critical area is achieved very selectively.

FIG. 4 shows a circuit diagram of a GTO thyristor (GTO) with anode (A), cathode (K) and gate electrode (G) which is connected to the cathode (K) via a series circuit of a resistor (R) and a trigger stabilization diode or diode (D). The resistor (R) has a resistance value in the range of 10 Ω–500 Ω, preferably in the range of 50 Ω–200 Ω.

Figure 5:
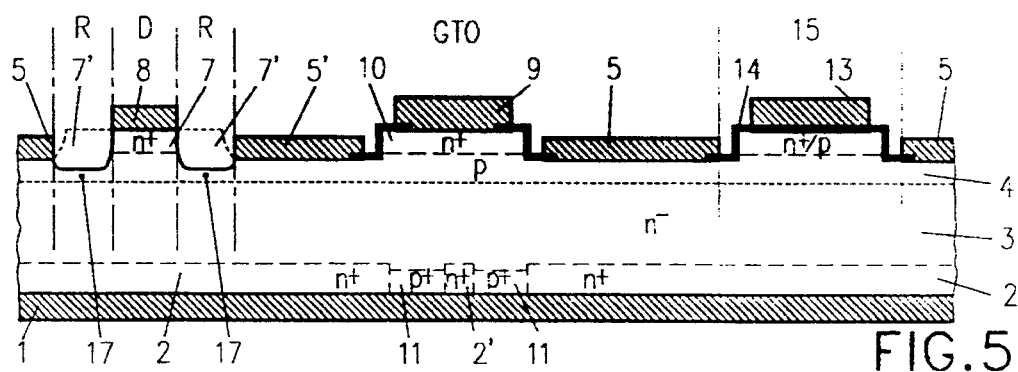
FIG. 5 shows a cross section through part of a gate-turn-off semiconductor component according to FIG. 1 having an additional segment for the trigger stabilization diode according to FIG. 4.

FIG. 5 shows, in addition to the exemplary embodiment of the invention shown in FIG. 1, a section of a cross section through a disk-shaped semiconductor component having an area for the diode (D) which is laterally adjacent to the GTO thyristor segment (GTO) and a resistor (R) arranged annularly around the diode (D). A 3-layer $n^+n^-p$-type area of the gate electrode metallization (5) of the GTO thyristor segment (GTO) is here laterally isolated from its 4-layer $p^+n^-pn^+$-type area by the areas of the resistor (R) and the diode (D).

The gate electrode (G) is connected directly to the p-type base layer (4) via gate electrode metallizations (5, 5') or, respectively, via a main gate electrode (5) and an auxiliary gate electrode (5'). In the area of the diode (D), the diode-cathode metallization (8), which is small in terms of area depending on the requirement, is connected to the p-type base layer (4) via an $n^+$-type diode-emitter layer (7).

In principle, the diode (D) can be constructed like a conventional GTO thyristor segment (GTO). In this case, a continuous $n^+$-type diode-emitter layer (7), which also extends over a laterally adjoining resistance region (7'), indicated by dashed lines, is produced in the mesa structure of the silicon. The current flow to the main gate electrode (5) and to the auxiliary gate electrode (5') of the contact of the gate electrode (G) is symmetric. This structure results in a very low series resistance (R) which could lead to too high a trigger current requirement for practical applications.

For the selective dimensioning of this resistor (R), the lateral extent of the $n^+$-type diode-emitter layer (7) can therefore be limited. The remaining, symmetrically arranged resistance region (7') only contains the p-doping and acts as part of the resistor (R). Since this resistor (R) is in most cases relatively small, this ensures good stabilization, particularly at high temperatures.

Instead of the p-doped resistance region (7'), a further increase in the resistance (R) can be achieved by reducing the thickness of the layer of the lateral area of the p-type base layer (4), for example by etching down to a certain depth. This resistance region is designated by (17). The low conductivity of the remaining p-type layer in the area of the resistance region (17) leads to a large resistance (R).

In all practical cases, it is attempted to have essentially the same geometric dimensioning of the resistor (R) along the entire edge of the diode (D).

The diode path on the cathode-side surface of the semiconductor component does not contribute anything to the actual current conduction of the GTO thyristor segment (GTO). Seen electrically, the trigger threshold of the total system can be raised considerably as a result. This effect is virtually independent of the local arrangement and distance of the individual areas; it acts as long as the stray inductance is small, even with a hybrid arrangement.

Since the effect of the diode (D) increases proportionally to its area, its geometric size is of importance.

The effectiveness is increased by a higher charge carrier life in the diode area (D) in comparison with the GTO thyristor segment area (GTO). If recombination centers are selected which exhibit a temperature dependence only above a critical temperature in the range between −40° C. and 125° C., a high leakage current can be additionally reduced at low temperatures.

Since the diode section (D) carries only a relatively low current, a diode metallization (8) with a small area is in most cases sufficient. For this reason, unused parts of the area of the cathode side of the semiconductor component can possibly be used for the area of the $n^+$-type diode-emitter layer (7).

When there are differences in the charge carrier life in the p-type base layer (4), there will be a great redistribution of the local currents. The GTO thyristor segment (GTO) having the shortest charge carrier life handles approximately the entire hole current shortly before the trigger threshold is reached. It follows from this that slight technological differences can lead to a severe change in the total trigger current.

Naturally, conventional metals or metal alloys can be used for the electrode metallizations (1, 5, 5', 8, 9, 13). Aluminum is preferably used. The semiconductor component can have a circular or other shape. It is important that, in particular, the GTO thyristor segments (GTO) at the edge are thermally relieved.

It is advantageous for the stabilization of the trigger threshold and the reduction of its temperature dependence to connect the gate electrode (G) of the GTO thyristor segment (GTO) electrically via a diode (D) to its cathode (K), the cathodes of these two components being short-circuited.

In principle, the diode (D) can also act stabilizing in hybrid form. It can be constructed as $n^+$p-type diode or as Schottky diode. The current through the diode (D) flows laterally from the gate electrode metallizations (5, 5') to the diode metallization (8). A parasitic current from the anode (A) is prevented by the $n^+$-type emitter layer (2).

In addition, the semiconductor component can have at least one diode, not shown in the figures, in antiparallel with the at least one GTO thyristor segment (GTO), as is usual for reverse-conducting thyristors.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

| | |
|---|---|
| 1 | Anode metalization, 1st main electrode |
| 2 | $n^+$-type short-circuit layer |
| 2' | $n^+$-type short-circuit layer in the center of 11 |
| 3 | $n^-$-type base layer |
| 4 | p-type base layer |
| 5 | Gate electrode metallization, main gate electrode |
| 5' | Gate electrode metallization, auxiliary gate electrode |
| 6, 14 | Electrical insulation layers |
| 7 | $n^+$-type diode-emitter layer |
| 7', 17 | Resistance regions, resistance zones, resistance paths |
| 8 | Diode metallization |
| 9 | GTO cathode metallization, 2nd main electrode |
| 10 | $n^+$-type GTO emitter layer |
| 11 | $p^+$-type GTO emitter layer |
| 11a | $p^+$-type GTO emitter layer 11 shortened at the edge |
| 12 | Cooling segment boundary layer |
| 13 | Cooling segment metallization |
| 15 | Cooling segment |
| a | Width of 11 |
| A | Anode |
| d | Width of 2' |
| D | Diode, trigger stabilization diode |
| G | Gate electrode |
| GTO | GTO thyristor, GTO thyristor segment |
| K | Cathode |

-continued

LIST OF DESIGNATIONS

| | |
|---|---|
| R | Resistor |
| Za | Outer ring, outer annular zone |
| Zi | Inner ring, inner annular zone |
| $\tau_1, \tau_2$ | Charge carrier lives |

What is claimed as new and desired to be secured by Letters Patent of the United States is:

1. A gate-turn-off semiconductor component with a disk-like semiconductor body comprising:

at least one GTO thyristor structure, said at least one GTO thyristor structure further including:
  a) at least one p-conducting $p^+$anode emitter layer adjacent to a metal anode of electrical conductivity;
  b) an n-conducting $n^-$base layer adjoining the $p^+$anode emitter layer;
  c) a p-conducting p-type base layer adjoining the $n^-$base layer;
  d) an n-conducting $n^+$cathode emitter layer adjoining the p-type base layer, and adjoining a metal cathode of electrical conductivity on a cathode side of the semiconductor component; and
  e) a control electrode;

at least one cooling segment peripherally and laterally adjacent to the at least one GTO thyristor structure, which shares the metal anode with the at least one GTO thyristor structure, the cooling segment having a cooling segment metallization on the cathode side; and an electrical insulation layer provided between the cooling segment metallization and the disk-like semiconductor body.

2. The gate-turn-off semiconductor component as recited in claim 1, wherein the electrical insulation layer is disposed between the cooling segment metallization and a control electrode metallization of the control electrode.

3. The gate-turn-off semiconductor component as recited in claim 2, wherein the cooling segment metallization is electrically connected to the metal cathode of the at least one GTO thyristor structure.

4. The gate-turn-off semiconductor component as recited in claim 3, wherein:

the control electrode is operatively connected to the metal cathode via at least one trigger stabilization diode, a conducting-state direction of the trigger stabilization diode being from the control electrode to the metal cathode.

5. The gate-turn-off semiconductor component as recited in claim 4, wherein:

the trigger stabilization diode has an $n^+$diode-emitter layer on the cathode side, this $n^+$diode-emitter layer being connected to the control electrode via at least one resistance path in the p-type base layer.

6. The gate-turn-off semiconductor component as recited in claim 1, wherein the cooling segment metallization is electrically connected to the metal cathode of the at least one GTO thyristor structure.

7. The gate-turn-off semiconductor component as recited in claim 1, wherein:

the control electrode is operatively connected to the metal cathode via at least one trigger stabilization diode, a conducting-state direction of the trigger stabilization diode being from the control electrode to the metal cathode.

8. The gate-turn-off semiconductor component as recited in claim 7, wherein:

the trigger stabilization diode has an n⁺diode-emitter layer on the cathode side, this n⁺diode-emitter layer being connected to the control electrode via at least one resistance path in the p-type base layer.

9. The gate-turn-off semiconductor component as recited in claim 1, wherein:

said at least one GTO thyristor structure is in an outer zone of the semiconductor body, said p⁺anode emitter layer being shortened such that in an edge region of the at least one GTO thyristor structure, there is no p⁺anode emitter layer opposite the n⁺cathode emitter layer.

10. The gate-turn-off semiconductor component as recited in claim 9, wherein:

in said edge region of said at least one GTO thyristor structure, a charge carrier life ($\tau 2$) is shorter than a charge carrier life ($\tau 1$) in a non-edge region of the at least one GTO thyristor structure.

11. The gate-turn-off semiconductor component as recited in claim 1, wherein:

in an edge region of said at least one GTO thyristor structure, a charge carrier life ($\tau 2$) is shorter than a charge carrier life ($\tau 1$) in a non-edge region of the at least one GTO thyristor structure.

12. A gate-turn-off semiconductor component with a disk-like semiconductor body comprising:

at least one GTO thyristor structure, said at least one GTO thyristor structure further including:
 a) at least one p-conducting p⁺anode emitter layer adjacent to a metal anode of electrical conductivity;
 b) an n-conducting n⁻base layer adjoining the p⁺anode emitter layer;
 c) a p-conducting p-type base layer adjoining the n⁻base layer;
 d) an n-conducting n⁺cathode emitter layer adjoining the p-type base layer, and adjoining a metal cathode of electrical conductivity on a cathode side of the semiconductor component; and
 e) a control electrode;

said at least one GTO thyristor structure being in an outer zone of the semiconductor body, said p⁺anode emitter layer being shortened such that in an edge region of the at least one GTO thyristor structure, there is no p⁺anode emitter layer opposite the n⁺cathode emitter layer.

13. The gate-turn-off semiconductor component as recited in claim 12, wherein:

the control electrode is operatively connected to the metal cathode via at least one trigger stabilization diode, a conducting-state direction of the trigger stabilization diode being from the control electrode to the metal cathode.

14. The gate-turn-off semiconductor component as recited in claim 13, wherein:

the trigger stabilization diode has an n⁺diode-emitter layer on the cathode side, this n⁺diode-emitter layer being connected to the control electrode via at least one resistance path in the p-type base layer.

15. The gate-turn-off semiconductor component as recited in claim 12, wherein:

in said edge region of said at least one GTO thyristor structure, a charge carrier life ($\tau 2$) is shorter than a charge carrier life ($\tau 1$) in a non-edge region of the at least one GTO thyristor structure.

16. A gate-turn-off semiconductor component with a disk-like semiconductor body comprising:

at least one GTO thyristor structure, said at least one GTO thyristor structure further including:
 a) at least one p-conducting p⁺anode emitter layer adjacent to a metal anode of electrical conductivity;
 b) an n-conducting n⁻base layer adjoining the p⁺anode emitter layer;
 c) a p-conducting p-type base layer adjoining the n⁻base layer;
 d) an n-conducting n⁺cathode emitter layer adjoining the p-type base layer, and adjoining a metal cathode of electrical conductivity on a cathode side of the semiconductor component; and
 e) a control electrode; and at least one cooling segment peripherally and laterally adjacent to the at least one GTO thyristor structure, which shares the metal anode with the at least one GTO thyristor structure, wherein in an edge region of said at least one GTO thyristor structure, a charge carrier life ($\tau 2$) is shorter than a charge carrier life ($\tau 1$) in a non-edge region of the at least one GTO thyristor structure.

17. The gate-turn-off semiconductor component according to claim 16, wherein said shorter charge carrier life ($\tau 2$) is generated by irradiating the semiconductor substrate with electrons in an energy range of 1 MeV to 2.5 MeV.

18. The gate-turn-off semiconductor component according to claim 16, wherein said shorter charge carrier life ($\tau 2$) is generated by irradiating the semiconductor substrate with protons.

19. The gate-turn-off semiconductor component according to claim 16, wherein said shorter charge carrier life ($\tau 2$) is generated by irradiating the semiconductor substrate with $\alpha$-particles.

20. The gate-turn-off semiconductor component as recited in claim 16, wherein:

the control electrode is operatively connected to the metal cathode via at least one trigger stabilization diode, a conducting-state direction of the trigger stabilization diode being from the control electrode to the metal cathode.

21. The gate-turn-off semiconductor component as recited in claim 20, wherein:

the trigger stabilization diode has an n⁺diode-emitter layer on the cathode side, this n⁺diode-emitter layer being connected to the control electrode via at least one resistance path in the p-type base layer.

22. The gate-turn-off semiconductor component according to claim 21, wherein the resistance path is generated by trench etching in the p-type base layer.

\* \* \* \* \*